(12) United States Patent
Liang et al.

(10) Patent No.: US 11,233,019 B2
(45) Date of Patent: Jan. 25, 2022

(54) MANUFACTURING METHOD OF SEMICONDCUTOR PACKAGE

(71) Applicant: Taiwan Semiconductor Manufacturing Co., Ltd., Hsinchu (TW)

(72) Inventors: Fang-Yu Liang, Taipei (TW); Ching-Feng Yang, Taipei (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 43 days.

(21) Appl. No.: 16/893,422

(22) Filed: Jun. 4, 2020

(65) Prior Publication Data
US 2020/0303331 A1  Sep. 24, 2020

Related U.S. Application Data

(63) Continuation of application No. 16/171,335, filed on Oct. 25, 2018, now Pat. No. 10,720,399.

(51) Int. Cl.
H01L 21/4763 (2006.01)
H01L 23/66 (2006.01)
(Continued)

(52) U.S. Cl.
CPC ............ *H01L 23/66* (2013.01); *H01L 21/288* (2013.01); *H01L 21/31053* (2013.01); *H01L 21/31127* (2013.01); *H01L 21/32051* (2013.01); *H01L 21/32115* (2013.01); *H01L 21/486* (2013.01); *H01L 21/4857* (2013.01); *H01L 21/561* (2013.01); *H01L 21/568* (2013.01); *H01L 21/6835* (2013.01); *H01L 23/3121* (2013.01); *H01L 23/3135* (2013.01); *H01L 23/5383* (2013.01); *H01L 23/5384* (2013.01); *H01L 23/5386* (2013.01); *H01L 23/5389* (2013.01); *H01L 23/552* (2013.01); *H01L 24/19* (2013.01); *H01L 24/20* (2013.01); *H01L 24/96* (2013.01); *H01L 25/16* (2013.01); *H01Q 1/40* (2013.01); *H01L 24/24* (2013.01); *H01L 2221/68359* (2013.01); *H01L 2221/68381* (2013.01); *H01L 2223/6672* (2013.01); *H01L 2223/6677* (2013.01); *H01L 2224/211* (2013.01);
(Continued)

(58) Field of Classification Search
CPC ............ H01L 21/288; H01L 21/31053; H01L 21/561; H01L 21/568; H01L 21/6835; H01L 21/31127; H01L 21/32051; H01L 21/32115; H01L 21/4857; H01L 21/486; H01L 21/23; H01L 21/3135; H01L 21/5383; H01L 21/5384; H01L 21/5386; H01L 21/5389; H01L 21/552; H01L 24/19; H01L 24/96; H01L 24/20; H01L 24/24; H01L 25/16
USPC ........................................................ 438/629
See application file for complete search history.

(56) References Cited

U.S. PATENT DOCUMENTS 9,431,369 B2 * 8/2016 Chih .................... H01Q 1/2283

* cited by examiner

Primary Examiner — Luan C Thai
(74) Attorney, Agent, or Firm — JCIPRNET

(57) ABSTRACT

A method including followings is provided. An encapsulated device including a semiconductor die and an insulating encapsulation laterally encapsulating the semiconductor die is provided. An insulating layer is formed over a surface of the encapsulated device. A groove pattern is formed on the insulating layer. A conductive paste is filled in the groove pattern and the conductive paste filled in the groove pattern is cured.

20 Claims, 15 Drawing Sheets

(51) Int. Cl.
*H01L 23/00* (2006.01)
*H01L 23/538* (2006.01)
*H01L 23/552* (2006.01)
*H01L 23/31* (2006.01)
*H01L 25/16* (2006.01)
*H01L 21/56* (2006.01)
*H01L 21/683* (2006.01)
*H01L 21/3205* (2006.01)
*H01L 21/311* (2006.01)
*H01L 21/3105* (2006.01)
*H01L 21/288* (2006.01)
*H01L 21/321* (2006.01)
*H01L 21/48* (2006.01)
*H01Q 1/40* (2006.01)

(52) U.S. Cl.
CPC .................. *H01L 2224/221* (2013.01); *H01L 2224/24265* (2013.01)

MANUFACTURING METHOD OF SEMICONDCUTOR PACKAGE

CROSS-REFERENCE TO RELATED APPLICATION

This is a continuation application of and claims the priority benefit of U.S. application Ser. No. 16/171,335, filed on Oct. 25, 2018, now allowed. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

Low Temperature Co-Fired Ceramic (LTCC) and printed circuit board (PCB) substrates can be used for integration of antennas with RF integrated circuits (ICs) in high frequency applications but those packages have power consumption issues resulting from interconnect losses from chip to antenna through solder bumps or balls. Therefore, improved antenna structures integrated into packaging is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
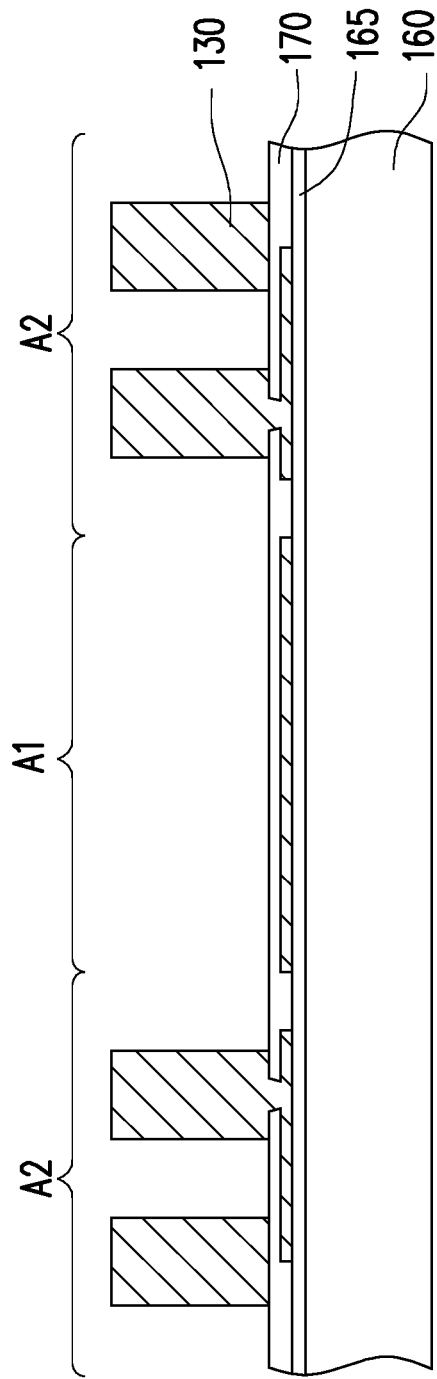
FIG. 1 to FIG. 11 illustrate schematic cross sectional views of various stages in a manufacturing process of a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 11 illustrate schematic cross sectional views of various stages in a manufacturing process of a semiconductor package in accordance with some embodiments. In exemplary embodiments, the manufacturing process of the semiconductor package disclosed herein may be part of a wafer level packaging process. In some embodiments, one semiconductor device is shown to represent plural semiconductor devices of the wafer, and one single package is shown to represent plural semiconductor packages obtained the following semiconductor manufacturing process. The intermediate stages of forming the semiconductor package are illustrated in accordance with some embodiments. The variations of the embodiments are discussed. Throughout the various views and illustrative embodiments, like reference numbers are used to designate like elements. The manufacturing process of the semiconductor package in the disclosure may include the following steps.

In some embodiments, the intermediate stages of forming the semiconductor package of the disclosure are described as follows. Referring to FIG. 1, a carrier 160 is provided, and an adhesive layer 165 may be disposed on the carrier 160. In some embodiments, the carrier 160 may be a glass carrier, a ceramic carrier, or the like. The adhesive layer 165 may be a light to heat conversion release coating (LTHC), or the like. In some embodiments, a (second) redistribution structure 170 may be optionally formed on the carrier 160, or on the adhesive layer 165 (if any). Then, a plurality of through vias 130 are formed on the carrier 160, and the through vias 130 may surround a central region A1 where a semiconductor device 110a is to be disposed. In the embodiments of redistribution structure 170 being formed on the carrier 160, the through vias 130 may be electrically connected to the redistribution structure 170.

In some embodiments, the through vias 130 are disposed on a peripheral region A2 of the carrier 160 surrounding the central region A1. It is noted that "central" and "peripheral" herein may not be interpreted literally but rather be deemed as spatially relative terms, which are intended to encompass different orientations of the device in use or operation in addition to the orientation depicted in the figures. In the present embodiment, the through vias 130 are formed on the redistribution structure 170 located on the carrier 160, but the disclosure is not limited thereto. In an alternative embodiment, the redistribution structure 170 and/or the adhesive layer 165 may be omitted, and the through vias 130 may be directly formed on the carrier 160.

In some embodiments, the through vias 130 may be pre-formed, and are then placed on the carrier 160. In alternative embodiments, the through vias 130 may be formed by, for example, plating process. The plating of the through vias 130 may be performed before the placement of at least one semiconductor device 110*a* (shown in FIG. 2), and may include the following steps. For example, a seed layer (not shown) is firstly over carrier 160, a photo resist layer (not shown) is formed and patterned, and the through vias 130 are plated on the portions of the seed layer that are exposed through the photo resist layer. The photo resist layer and the portions of the seed layer covered by the photo resist layer may then be removed. The semiconductor device 110*a* may then be placed over the carrier 160. The material of the through vias 130 may include copper, aluminum, or the like. Accordingly, the bottom ends of the through vias 130 are substantially level with the back surface of the semiconductor device 110*a*.

Figure 2:
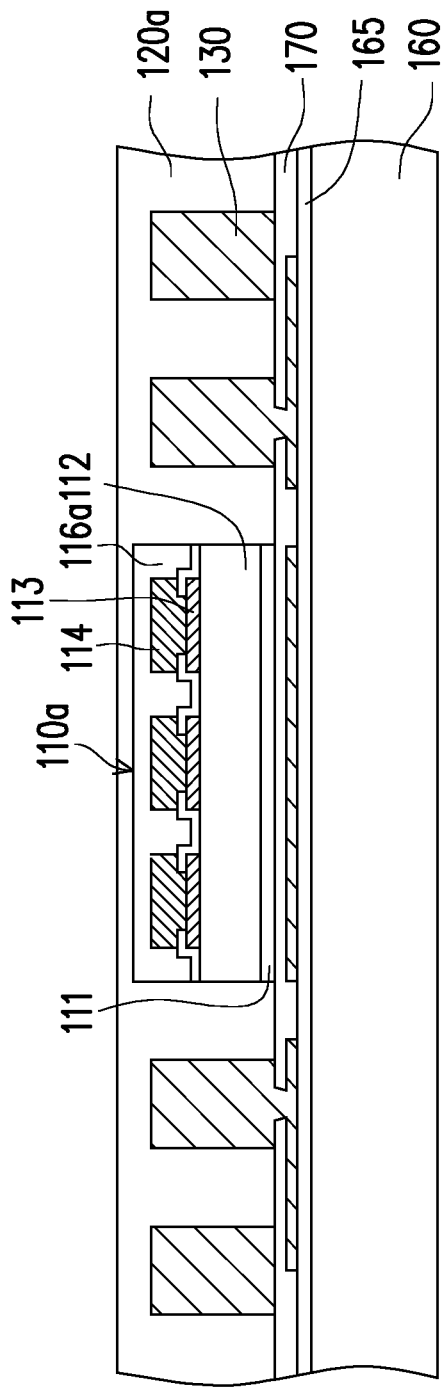

With now reference to FIG. 2, in some embodiments, at least one semiconductor device 110*a* as shown in FIG. 2 is provided on the carrier 160 and located within the central area A1 (shown in FIG. 1). In the present embodiment, the semiconductor device 110*a* is provided on the (second) redistribution structure 170 located on the carrier 160, but the disclosure is not limited thereto. In some embodiments, the semiconductor device 110*a* may be attached to the carrier 160 via a die attach film (DAF) 111 as shown in FIG. 2. The DAF 111 may include a polymer and in some embodiments comprises a thermoplastic material. The DAF 111 may be liquid, e.g., a thick liquid, when applied but forms a solid at room temperature. The DAF 111 material may become semi-liquid when heated and may become sticky to function as an adhesive at elevated temperatures. The DAF 111 may include a polymer-based film that functions as an adhesive when heated, in some embodiments, for example.

In some embodiments, the semiconductor device 110*a* may be logic chips including logic circuits therein. In some exemplary embodiments, the number of the semiconductor device 110*a* may be plural and are device dies that are designed for mobile applications, and may include a Power Management Integrated Circuit (PMIC) die and a Transceiver (TRX) die, for example. Although one semiconductor device 110*a* are illustrated herein, more semiconductor devices may be placed over the carrier 160 and may be level with one another.

In some exemplary embodiments, a plurality of conductive vias 114 (such as copper vias) may be formed on an active surface (e.g. the top surface) of the semiconductor device 110*a* and electrically coupled to the pads 113 on the substrate 112 of the semiconductor device 110*a*. In some embodiments, a dielectric layer 116*a* may be formed on the active surface (e.g. the top surface) of the semiconductor device 110*a*, and may cover the top surfaces of the conductive vias 114. In other embodiments, the top surface of the dielectric layer 116*a* may be substantially level with the top surfaces of the conductive vias 114. Alternatively, the dielectric layer 116*a* may be omitted, and the conductive vias 114 protrude from the active surface of the semiconductor device 110. In some embodiments, the top ends of the through vias 130 may be substantially level with the top surfaces of the conductive vias 114. In other embodiments, the top ends of the through vias 130 may be substantially higher than the top surfaces of the conductive vias 114. Alternatively, the top ends of the through vias 130 may be substantially lower than the top surfaces of the conductive vias 114 but substantially higher than the bottom surfaces of the conductive vias 114. In some embodiments, the conductive vias 114 face away from the carrier 160. Namely, the active surface of the semiconductor device 110*a* faces away from the carrier 160 (or the second redistribution structure 170).

Then, the semiconductor device 110*a* and the through vias 130 on the carrier 160 are encapsulated by an encapsulating material 120*a*. In other words, the encapsulating material 120*a* is formed on the carrier 160 to encapsulate the through vias 130 and the semiconductor device 110*a*. In some embodiments, the encapsulating material 120*a* fills the gaps between the semiconductor device 110*a* and the through vias 130, and may be in contact with the redistribution structure 170. The encapsulating material 120*a* may include a molding compound, an epoxy, or a resin, etc. In some embodiments, a top surface of the encapsulating material 120*a* may be higher than the top ends of the through vias 130 and the top surface of the dielectric layer 116*a*. Namely, the encapsulating material 120*a* covers the top ends of the through vias 130 and the top surface of the dielectric layer 116*a*.

Figure 3:
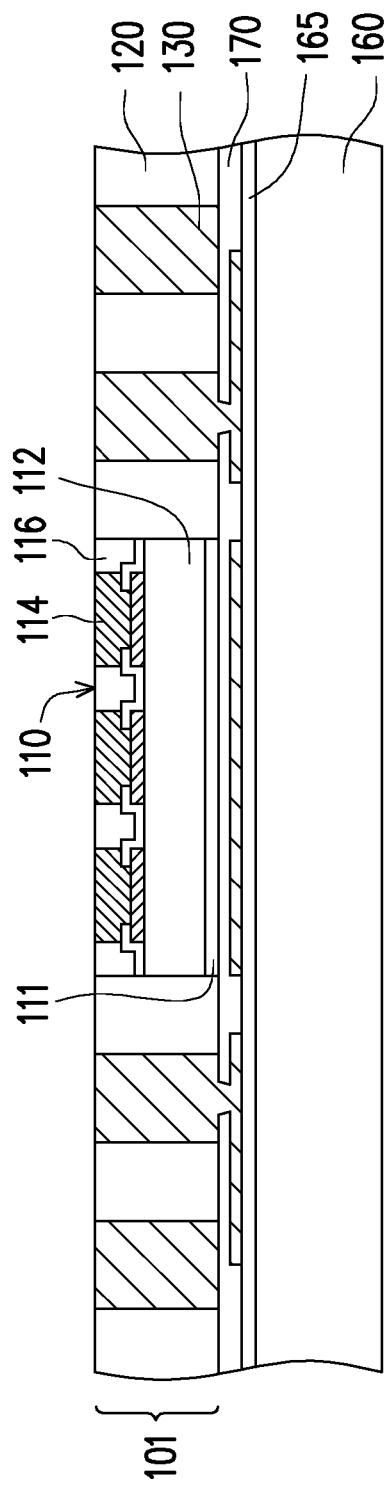

With now reference to FIG. 3, then, a thinning process, which may be a grinding process, is performed to thin the encapsulating material 120*a* (and the dielectric layer 116*a*) until the top ends of the through vias 130 and the top surfaces of the conductive vias 114 are revealed. The resulting structure is shown in FIG. 3. Due to the thinning process, the top ends of the through vias 130 are substantially level with the top surfaces of the conductive vias 114, and are substantially level with the top surface of the encapsulating material 120 and the top surface of the dielectric layer 116 as shown in FIG. 3. The grinding process may include mechanical grinding or chemical mechanical polishing (CMP), for example. After the grinding process, a cleaning step may be optionally performed, for example, to clean and remove the residue generated from the grinding step. However, the disclosure is not limited thereto, and the thinning step may be performed through any other suitable method.

Throughout the description, the resultant structure including the semiconductor device 110, the through vias 130 and the encapsulating material 120 as shown in FIG. 3 is referred to as an encapsulated semiconductor device 101, which may have a wafer form in the process. Accordingly, in the encapsulated semiconductor device 101, the semiconductor device 110 is disposed on the carrier 160, the through vias 130 extend through the encapsulating material 120, and the encapsulating material 120 encapsulates the semiconductor device 110 and the through vias 130. In other words, the encapsulating material 120 encapsulates the semiconductor device 110 therein, and the through vias 130 extends through the encapsulating material 120.

Figure 4:
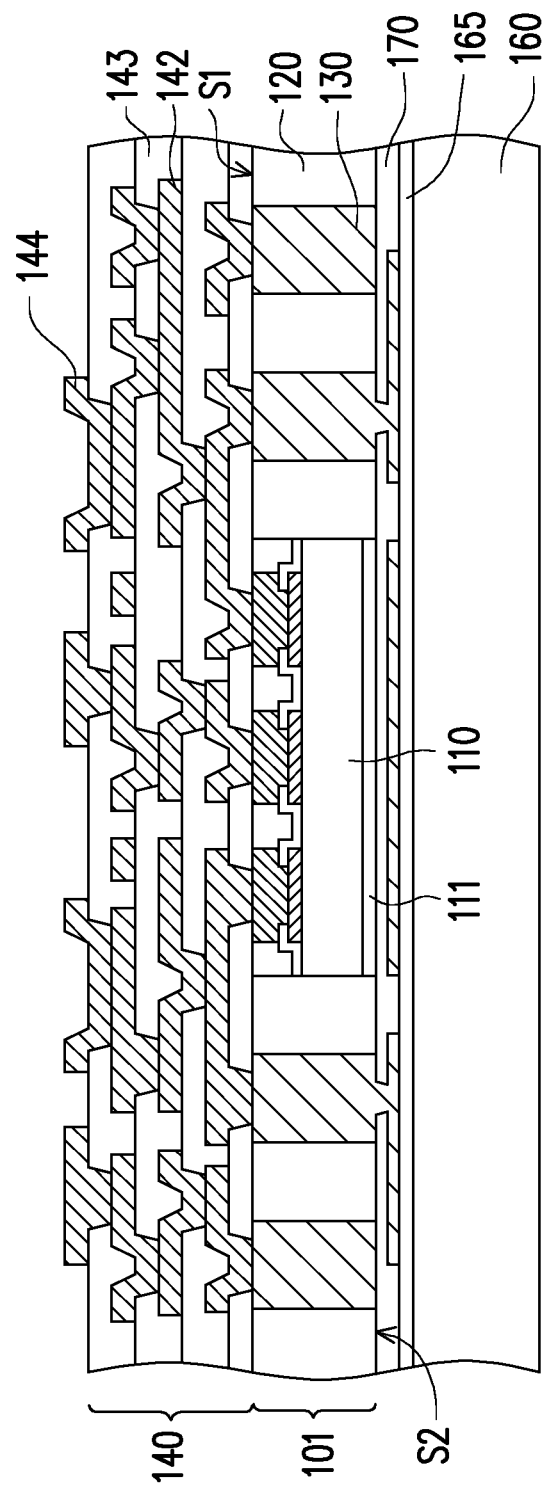

With now reference to FIG. 4, a (first) redistribution structure 140 is formed on a first side S1 of the encapsulated semiconductor device 101. The redistribution structure 140 is electrically connected to the semiconductor device 110 and the through vias 130 of the encapsulated semiconductor device 101. In some embodiments, the redistribution structure 140 are formed over the encapsulated semiconductor device 101 to connect to the conductive vias 114 of the semiconductor device 110 and the through vias 130. In some embodiments, the redistribution structure 140 may also interconnect the conductive vias 114 and the through vias 130. The redistribution structure 140 may be formed by, for example, depositing conductive layers, patterning the conductive layers to form redistribution circuits 142, partially covering the redistribution circuits 142 and filling the gaps between the redistribution circuits 142 with dielectric layers 143, etc. The material of the redistribution circuits 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the first semiconductor device 110 and the through vias 130. In addition, an Under Bump Metallurgy (UBM) layer 144 may be formed on the redistribution structure 140 by sputtering, evaporation, or electroless plating, etc.

Figure 5:
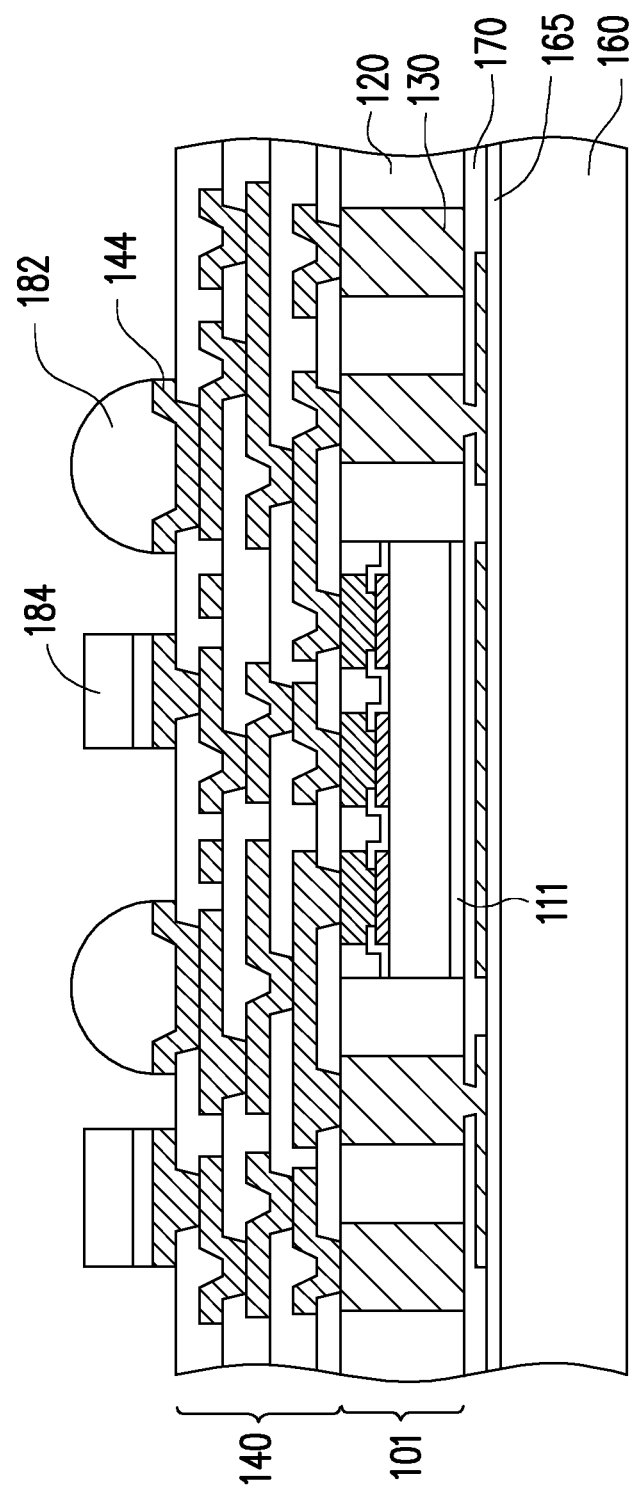

Referring to FIG. 5, a plurality of electrical connectors 182 are disposed on the UBM layer 144 of the redistribution structure 140 in accordance with some exemplary embodiments. In some embodiments, at least one Integrated Passive Device (IPD) 184 may be optionally disposed on the redistribution structure 140. The formation of the electrical connectors 182 may include placing solder balls on the UBM layer 144 (or on the redistribution structure 140), and then reflowing the solder balls. In alternative embodiments, the formation of the electrical connectors 182 may include performing a plating process to form solder regions on the UBM layer 144 (or on the redistribution structure 140), and then reflowing the solder regions. The electrical connector 182 may also include conductive pillars, or conductive pillars with solder caps, which may also be formed through plating. The IPD 184 may be fabricated using standard wafer fabrication technologies such as thin film and photolithography processing, and may be mounted on the redistribution structure 140 through, for example, flip-chip bonding or wire bonding, etc.

Figure 6:
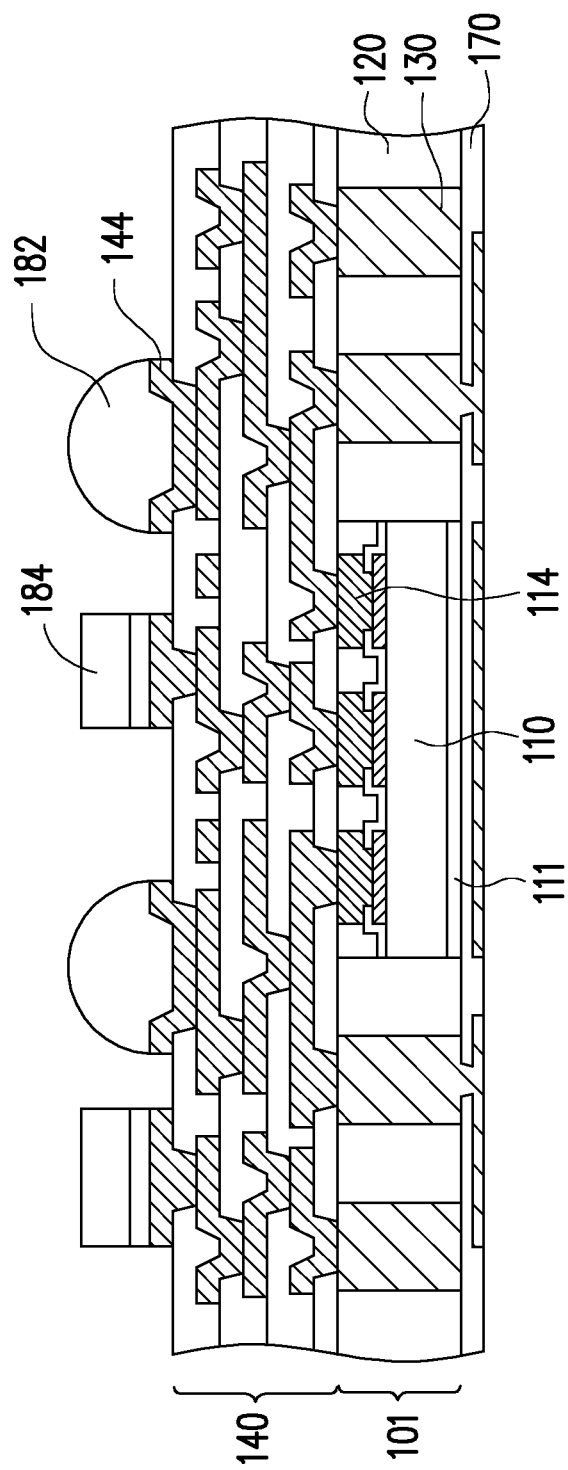

With now reference to FIG. 5 and FIG. 6, then, the carrier 160 may be removed. In some embodiments, the carrier 160 is detached from the encapsulated semiconductor device 101 or the redistribution structure 170, by causing the adhesive layer 165 to lose or reduce adhesion. The adhesive layer 165 is then removed along with the carrier 160. For example, the adhesive layer 165 may be exposed to UV light, so that the adhesive layer 165 loses or reduces adhesion, and hence the carrier 160 and the adhesive layer 165 can be removed from the encapsulated semiconductor device 101.

Figure 7:
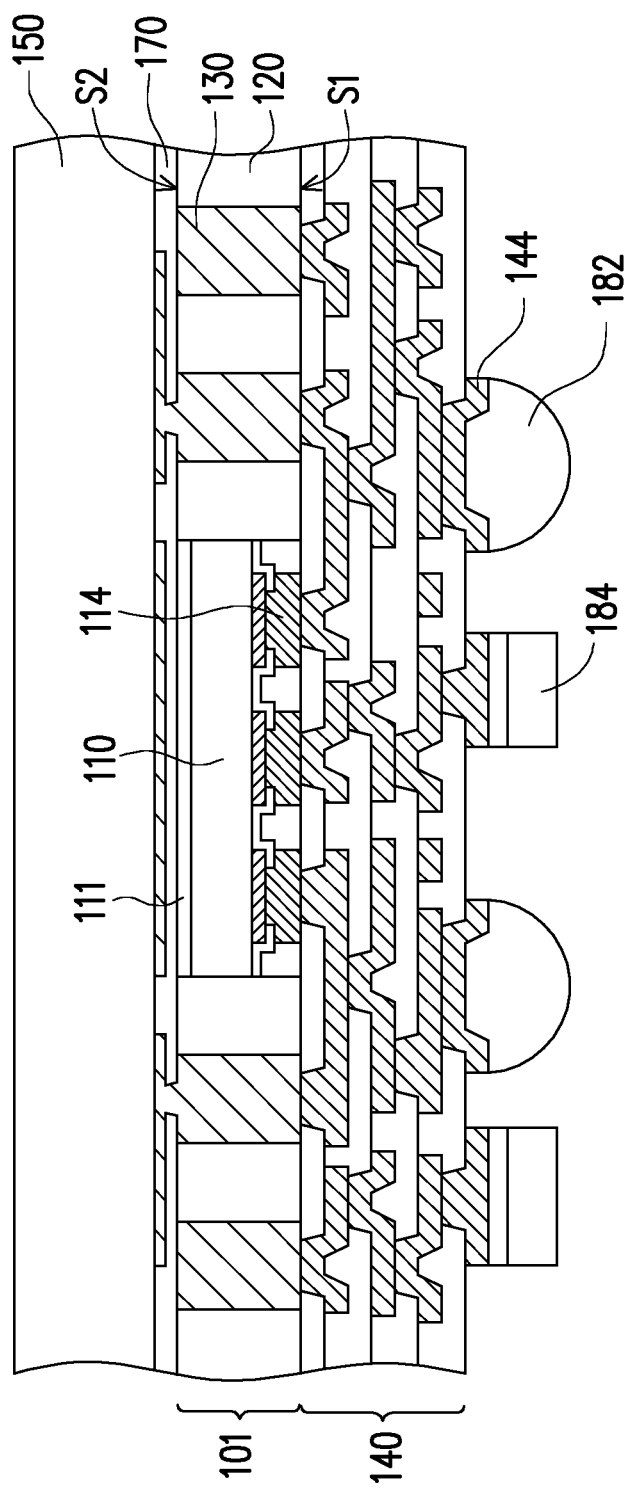

With now reference to FIG. 7, the resultant structure shown in FIG. 6 may then be flipped over with the second side S2 of the encapsulated semiconductor device 101 and the redistribution structure 170 facing up. In the present embodiment, the (second) redistribution structure 170 is located on the second side S2 of the encapsulated semiconductor device 101, which is opposite to the first side S1 where the (first) redistribution structure 140 is disposed. Then, an insulating layer 150 is formed on the second side of the encapsulated semiconductor device 101. In the present embodiment, insulating layer 150 is formed on the redistribution structure 170 where the carrier 160 is removed from. In some embodiments, the material of the insulating layer 150 may be the same as the material of the encapsulation material 120. For example, the insulating layer 150 may include a molding compound, an epoxy, a resin, an insulating film, an insulating coating with or without filler mixed therein, or the combination thereof.

Figure 8:
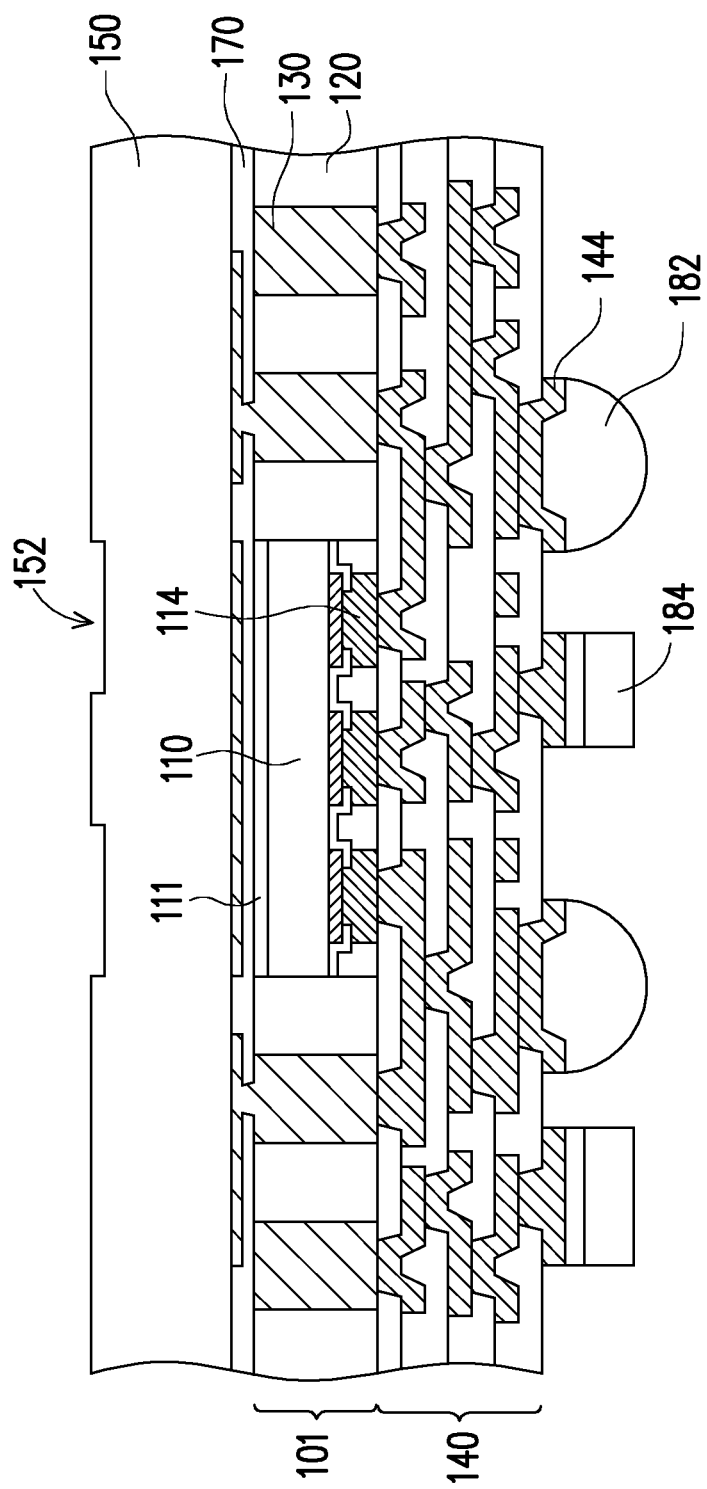

With now reference to FIG. 8, in some embodiments, a groove pattern 152 is formed on the insulating layer 150. In other words, the insulating layer 150 is partially removed to form the groove pattern 152. In some embodiments, the groove pattern 152 is used to define patterns of an antenna that will be formed later. In some embodiments, the groove pattern 152 is formed by a laser drilling process. In some other embodiments, the groove pattern 152 may be formed by a photolithography process, an etching process, an energy beam drilling process, another applicable process, or a combination thereof. The disclosure does not limit the way of forming the groove pattern 152 on the insulating layer 150.

Figure 9:
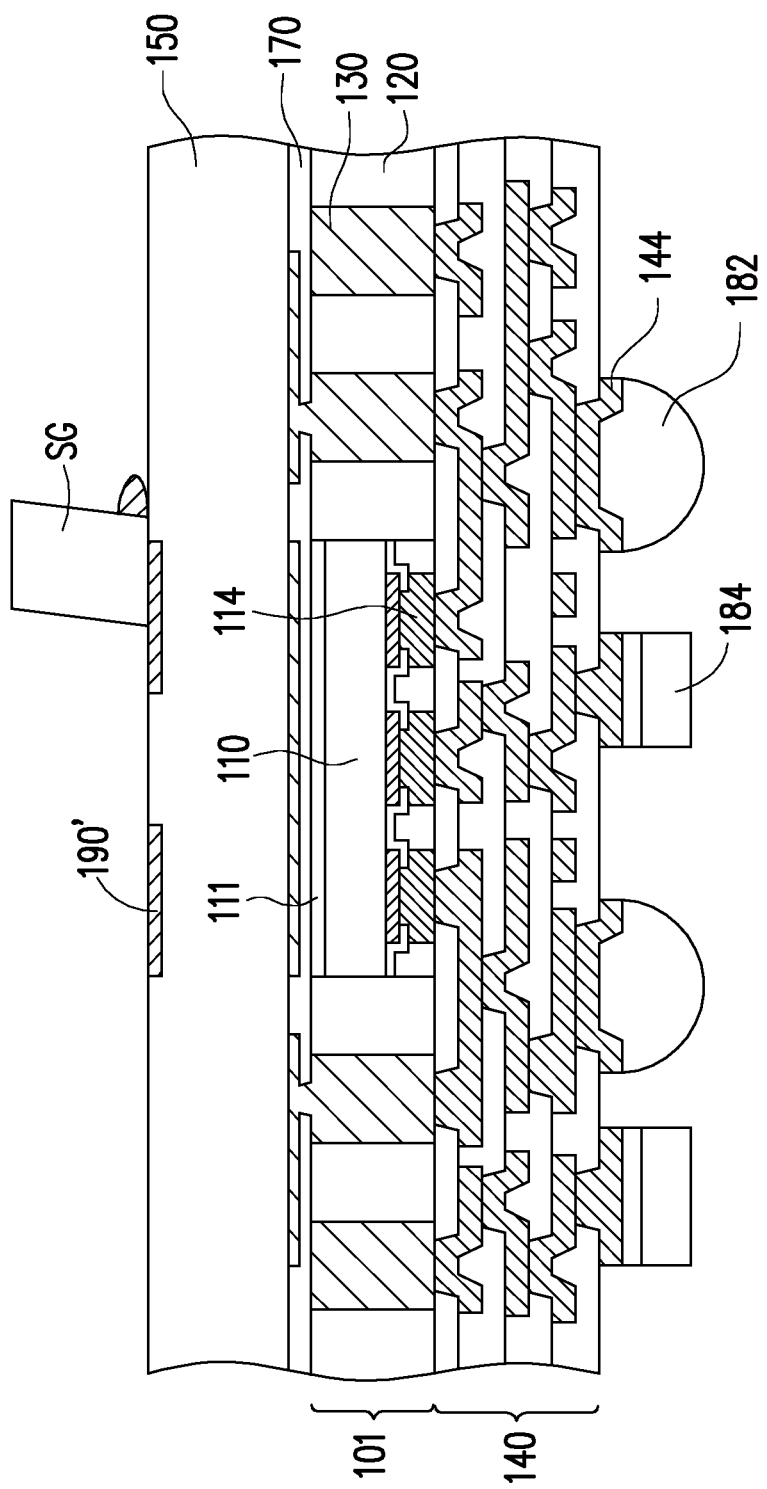

With now reference to FIG. 9, in some embodiments, a conductive paste 190' is filled in the groove pattern 152. For example, a squeegee SG may be used to move the conductive paste 190' into the groove pattern 152 as shown in FIG. 9 in accordance with some embodiments. Therefore, the conductive paste 190' is embedded in the insulating layer 150. In some embodiments, the conductive paste 190' includes a copper-containing paste material, a gold-containing paste material, another suitable material, or a combination thereof.

Figure 10:
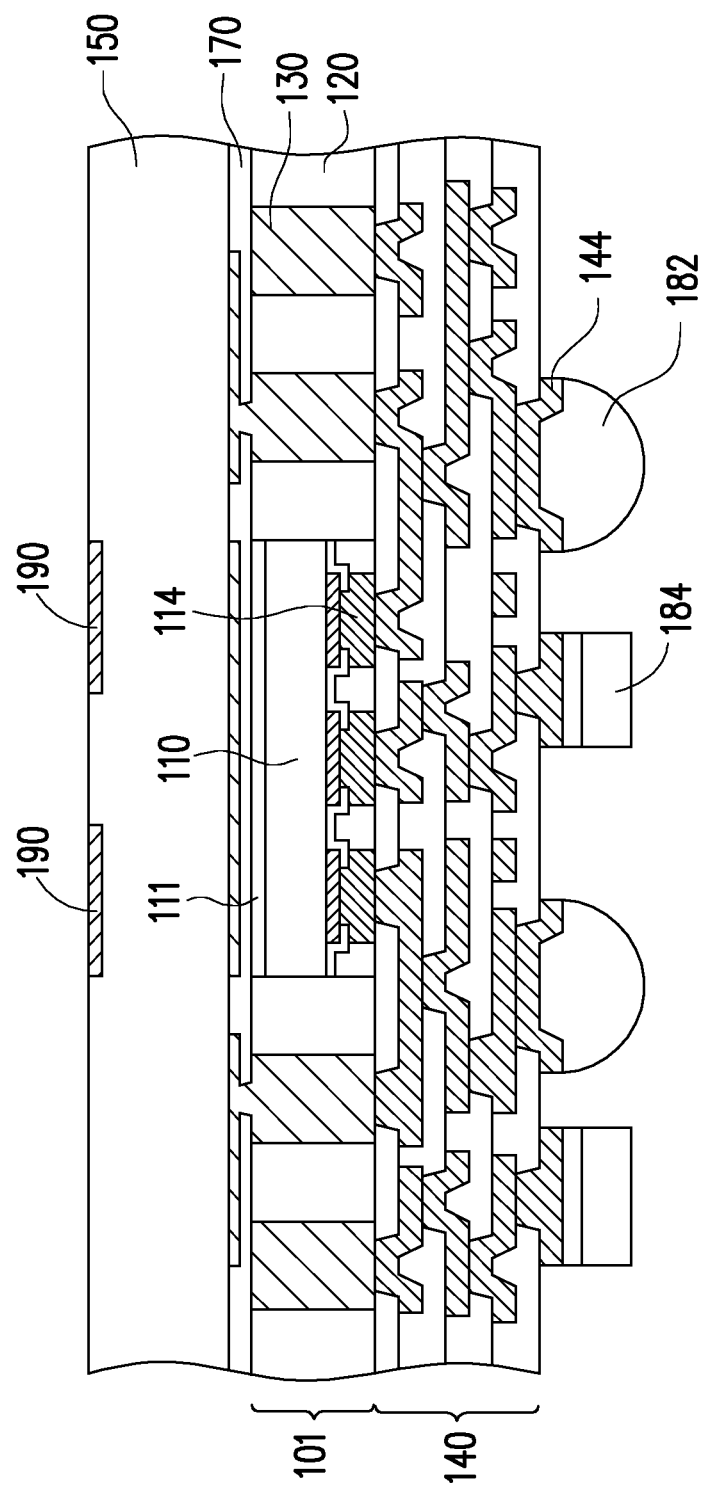

With now reference to FIG. 9 and FIG. 10, in some embodiments, a curing process is performed on the conductive paste 190' form an antenna 190 shown in FIG. 10. As a result, the conductive paste 190' turns into conductive layer fully filling the groove pattern 152. The conductive layer form the antenna 190 shown in FIG. 10. In some embodiments, the operation temperature of the curing process may be in a range from about 180° C. to about 250° C. In some embodiments, the operation time of the curing process may be in a range from 30 minutes to about 2 hours. Certainly, the disclosure is not limited thereto.

In some embodiments, a plurality of through vias (not shown) may be formed in the insulating layer 150. In some embodiments, the second redistribution structure 170 and the antenna 190 are disposed on two opposite sides of the insulating layer 150 respectively, and the through vias may extend through the insulating layer 150 for electrically connecting the second redistribution structure 170 and the antenna 190.

In some embodiments, a planarizing process may be optionally performed on the antenna 190 and the insulating layer 150 after the conductive paste 190' is cured. Accordingly, the upper surface of the antenna 190 is substantially coplanar with the upper surface of the insulating layer 150. In some embodiments, the planarizing process may be a grinding process such as mechanical grinding or chemical mechanical polishing (CMP), for example. After the grinding process, a cleaning step may be optionally performed, for example, to clean and remove the residue generated from the grinding step. However, the disclosure is not limited thereto, and the planarizing process may be performed through any other suitable method.

Figure 11:
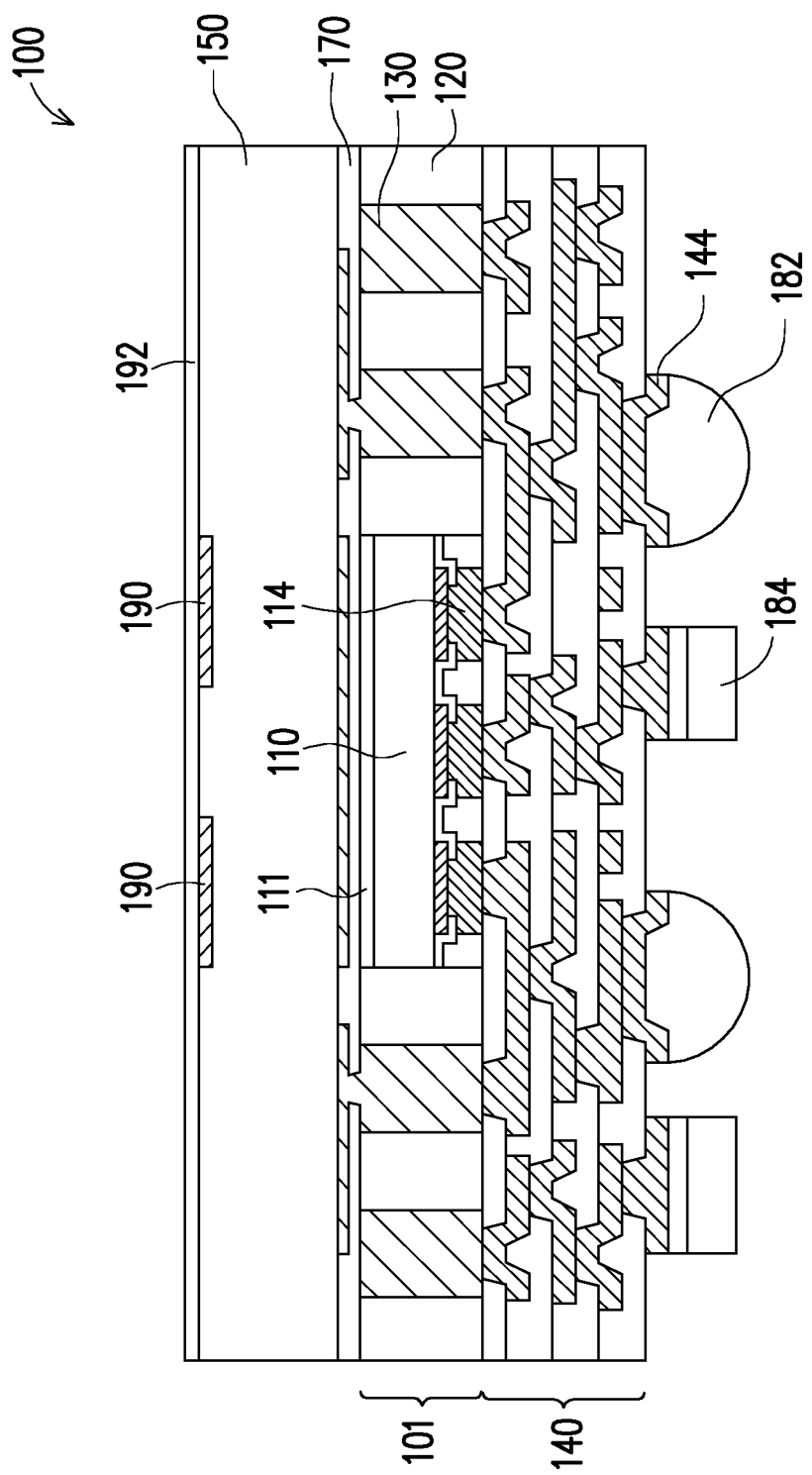

With now reference to FIG. 11, in some embodiments, a protection layer 192 may be optionally formed on the insulating layer 150 to cover the upper surface of the antenna 190 and the upper surface of the insulating layer 150. The protection layer 192 may be formed by coating, spraying, laminating, etc., and used to protect the antenna 190 (from oxidation for example) in accordance with some embodiments. In some embodiments, the protection layer 192 has a substantially planar top surface. The protection layer 192 may be made of or include a polymer material. The polymer material may be made of or include polyimide, epoxy-based resin, polybenzoxazole (PBO), another suitable polymer material, or a combination thereof. In some other embodiments, the protection layer 192 is made of or includes silicon nitride, silicon oxide, silicon oxynitride, silicon carbide, another suitable dielectric material, or a combination thereof. In some embodiments, the protection layer 192 is formed using a spin-on process, a spray coating process, a chemical vapor deposition (CVD) process, a physical vapor deposition (PVD) process, another applicable process, or a combination thereof.

Then, a singularizing process is performed to the wafer-form semiconductor package to form a plurality of semiconductor packages 100 (one of the semiconductor packages 100 is illustrated) independent from one another. In an embodiment, the singularizing process may be performed by using a saw blade to slice through the wafer-form semiconductor package. However, as one of ordinary skill in the art will recognize, utilizing a saw blade to singularize the semiconductor package 100 is merely one illustrative embodiment and is not intended to be limiting. Alternative methods for singularizing the semiconductor package 100, such as utilizing one or more etches to singularize the semiconductor package 100 may alternatively be utilized. These methods and any other suitable methods may alternatively be utilized for singularizing process. At the time, the manufacturing process of the semiconductor package 100 may be substantially done.

Figure 12:
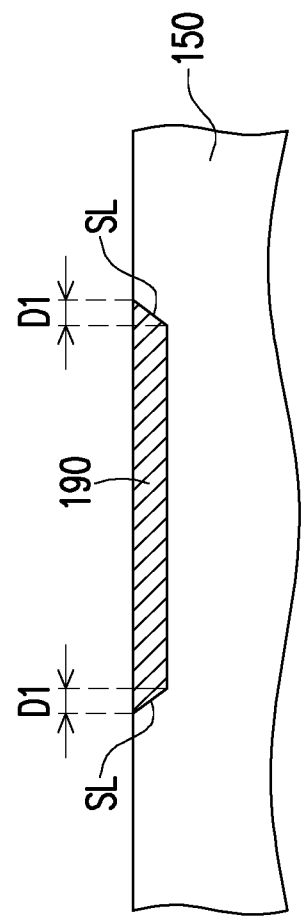
FIG. 12 illustrates a schematic partial enlarged view of an antenna in a semiconductor package in accordance with some embodiments.

FIG. 12 illustrates a schematic partial enlarged view of an antenna in a semiconductor package in accordance with some embodiments. With now reference to FIG. 11 and FIG. 12, since the antenna 190 is formed by filled in the groove pattern 152, which is formed by, for example, laser drilling, the slope SL of the antenna 190 (i.e. the slope SL of the groove pattern 152) can be easily controlled. In some embodiments, a horizontal distance D1 of the slope SL can be controlled to be substantially equal to or less than 5 μm, so as to improve design flexibility and controllability of pattern of the antenna 190. In addition, the thickness of the antenna 190 can be easily controlled, so that issue of bleeding of the antenna (due to thickness variation) formed by screen printing method can be avoided. In some embodiments, alignment of the laser for forming the groove pattern 152 can be applied from the bottom (i.e. the first side of the encapsulated semiconductor device 101) by attaching the encapsulated semiconductor device 101 on a transparent tape carrier. Thereby, the alignment can be made without forming alignment holes on the wafer structure, so no good die would be ruined or wasted. Moreover, a mask or a stencil for forming antenna by screen printing method can be omitted, so production cost of the semiconductor package 100 can be reduced. Furthermore, since the antenna 190 is embedded in the insulating layer 150 instead of protruding on the insulating layer 150, the thickness of the protection layer 192 can be reduced, so as to further reduce the production cost. For example, the thickness of the protection layer 192 is substantially equal to or less than 20 μm.

FIG. 13 to FIG. 17 illustrate schematic views of semiconductor packages in accordance with some embodiments. The antenna 190 and the manufacturing method thereof described above may be applied to variety of semiconductor packages with different configurations. FIG. 13 to FIG. 17 merely illustrate some of the semiconductor packages in accordance with some embodiments, and are not intended to limit the disclosure.

Figure 13:
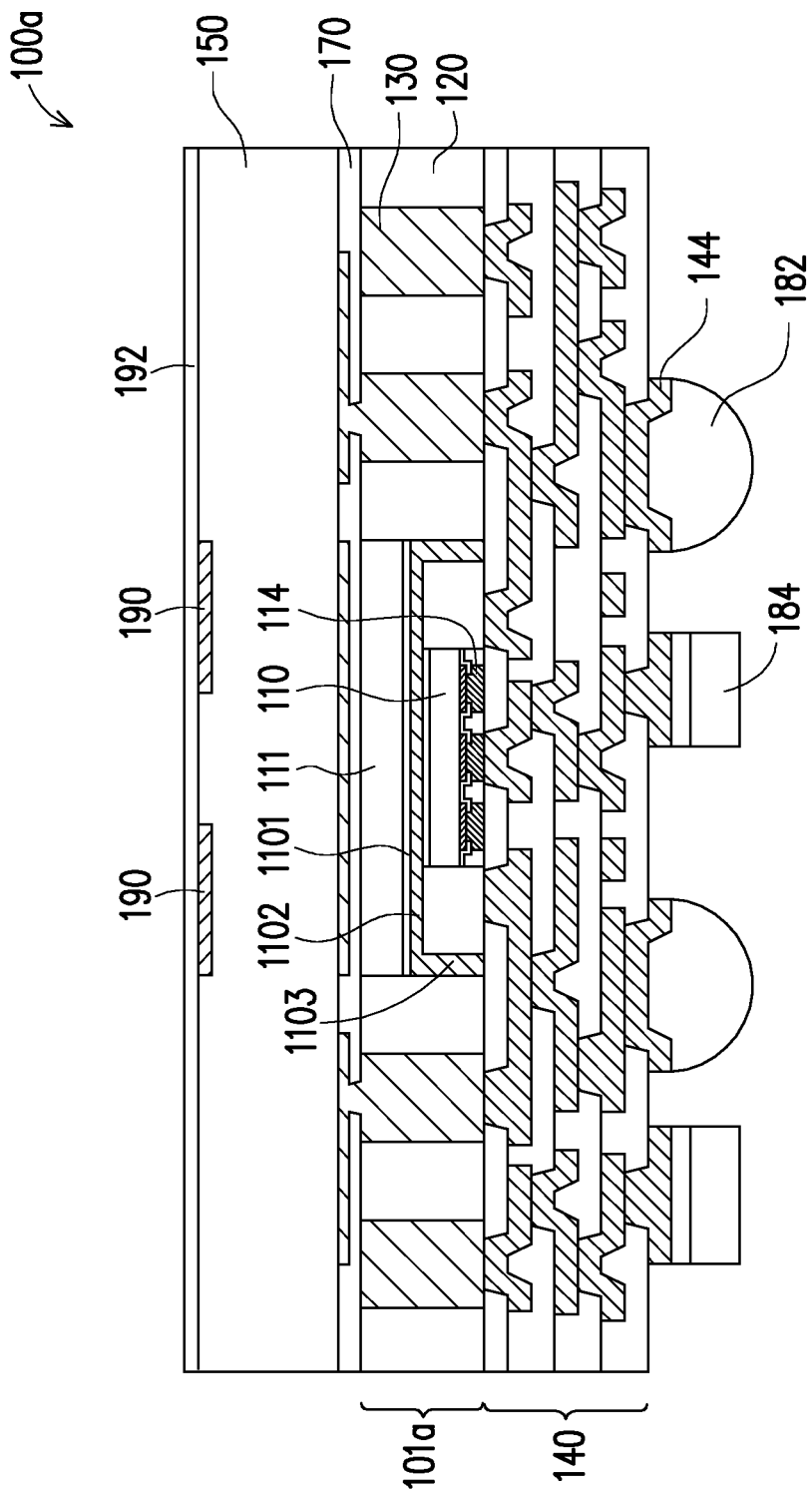
FIG. 13 to FIG. 17 illustrate schematic views of semiconductor packages in accordance with some embodiments.

With now reference to FIG. 13, in some embodiments, the semiconductor device 110 of the encapsulated semiconductor device 101a may be shielded by a conductive shield, which is coupled to the first redistribution structure 140. For example, a die attach film (DAF) 111 may be disposed between the second redistribution structure 170 and the semiconductor device 110. A dielectric layer 1101 is provided on the DAF 111. Then, a conductive layer 1102 is formed over the dielectric layer 1101, and a plurality of conductive pillars 1103 is formed on the conductive layer 1102 and extended to be coupled to the first redistribution structure 140. Accordingly, the conductive layer 1102 and the conductive pillars 1103 jointly formed the conductive shield for shielding the semiconductor device 110. The antenna 190 may be embedded in the insulating layer 150 formed on the encapsulated semiconductor device 101a to form the semiconductor package 100a.

Figure 14:
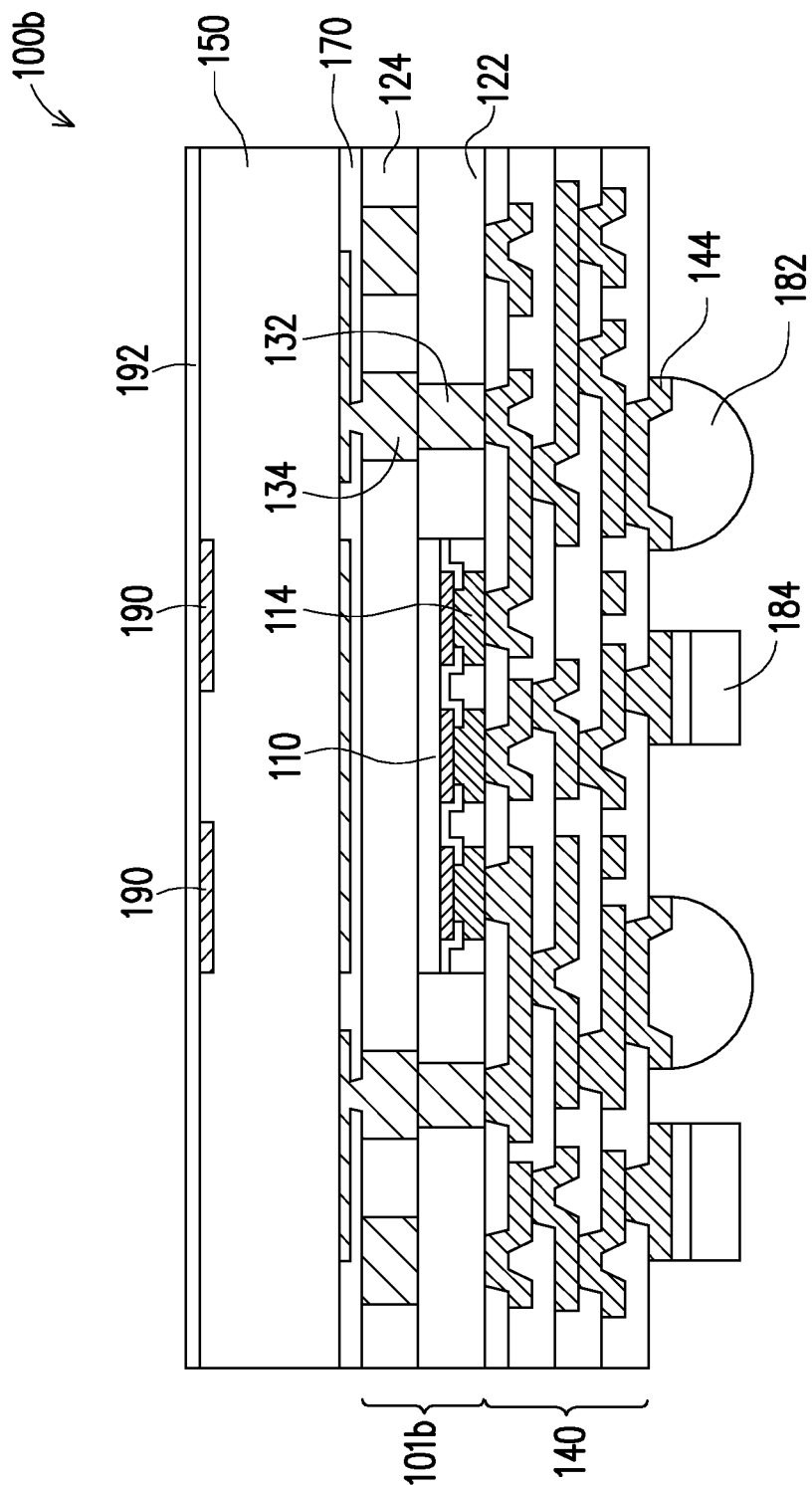

With now reference to FIG. 14, in some embodiments, the encapsulated semiconductor device 101a may be formed by a two-step (two-layer) process. For example, for the first step (first layer), a plurality of second through vias 134 are provided on the second redistribution structure 170, and a second encapsulation material 124 encapsulates the second through vias 134. Then, for the second step (second layer), the semiconductor device 110 and a plurality of first through vias 132 are provided on second encapsulation material 124, and a first encapsulation material 122 encapsulates the semiconductor device 110 and the first through vias 132. Accordingly, the encapsulated semiconductor device 101a includes the encapsulation material 122 encapsulating the semiconductor device 110, the encapsulation material 124 disposed over the semiconductor device 110 and the encapsulation material 122, the through vias 132 extending through the encapsulation material 122 and the through vias 134 extending through the encapsulation material 124 and connecting the through vias 132. The antenna 190 may be embedded in the insulating layer 150 formed on the encapsulated semiconductor device 101b to form the semiconductor package 100b.

Figure 15:
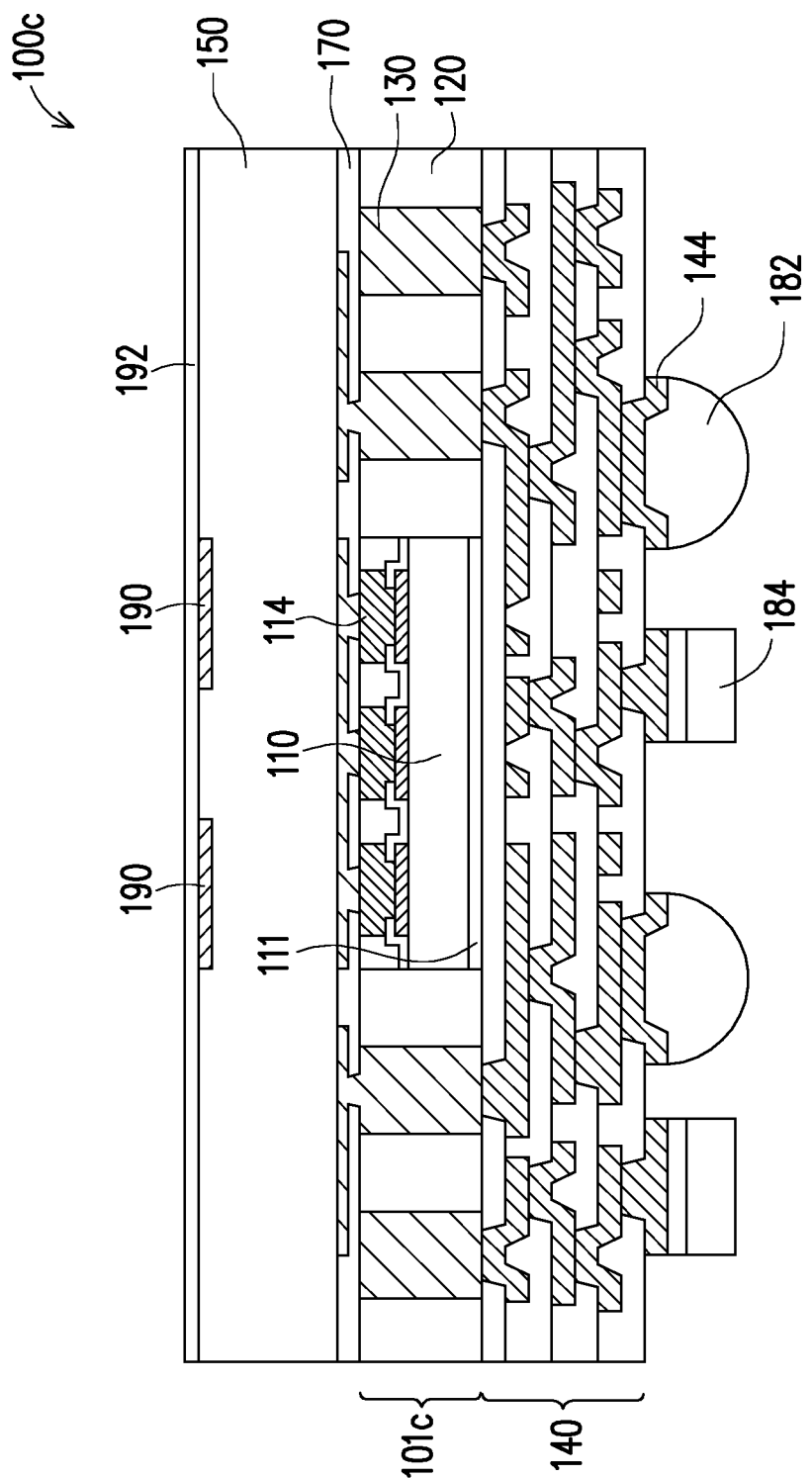

With now reference to FIG. 15, in some embodiments, the conductive vias 114 of the semiconductor device 110 may face the second redistribution structure 170 and be electrically connected to the second redistribution structure 170. In the present embodiments, the order of the manufacturing process may start from forming the first redistribution structure 140 on the carrier 160 instead of starting from forming the second redistribution structure 170. However, the disclosure is not limited thereto. The antenna 190 may be embedded in the insulating layer 150 formed on the encapsulated semiconductor device 101c to form the semiconductor package 100c.

Figure 16:
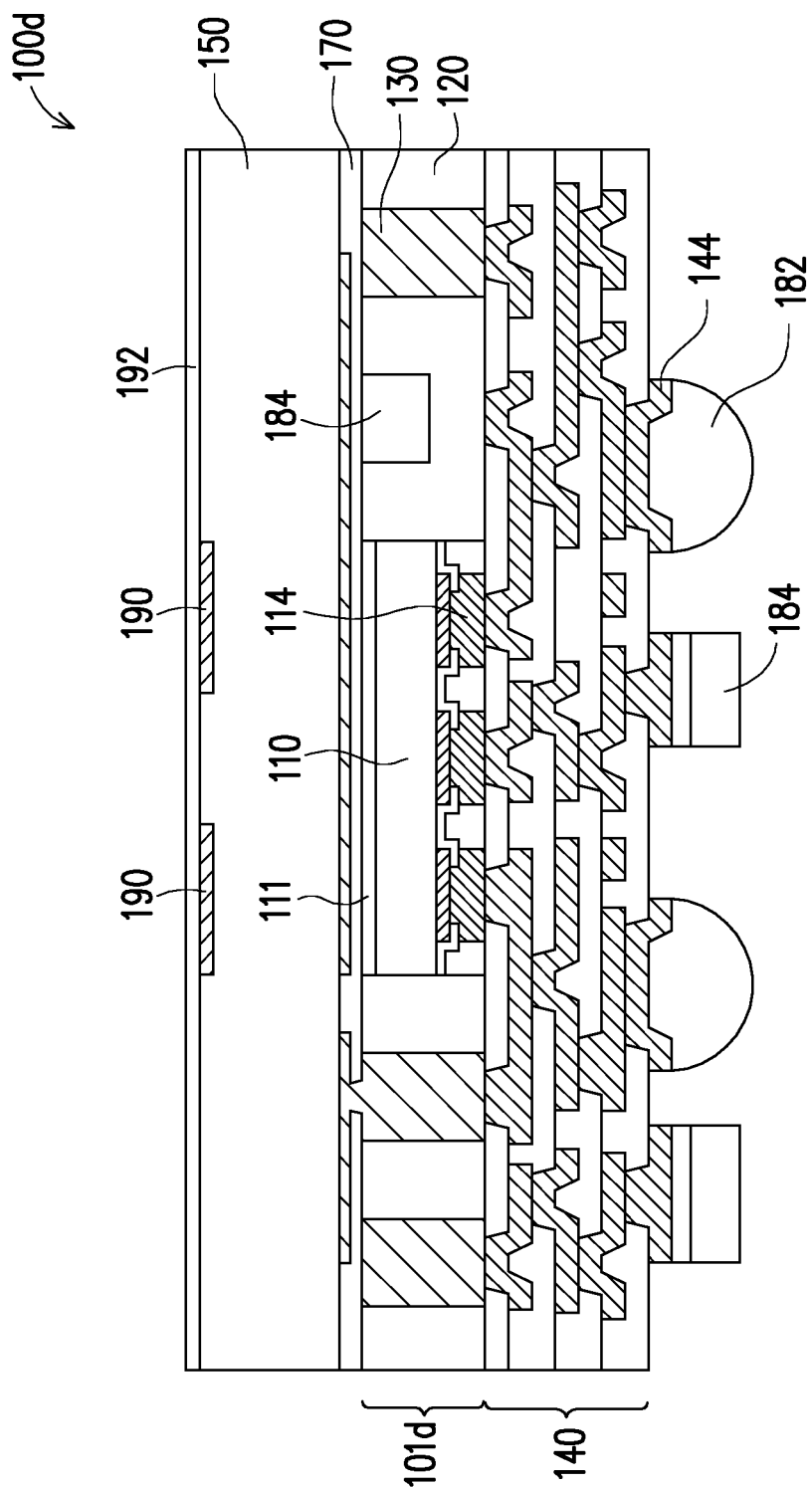

With now reference to FIG. 16, in some embodiments, the encapsulated semiconductor device 101d may further include an integrated passive device (IPD) 184 encapsulated by the encapsulation material 120. In some embodiments, the IPD 184 may be fabricated using standard wafer fabrication technologies such as thin film and photolithography processing, and may be the same as or different from the IPD 184 mounted on the redistribution structure 140. The antenna 190 may be embedded in the insulating layer 150 formed on the encapsulated semiconductor device 101d to form the semiconductor package 100d.

Figure 17:
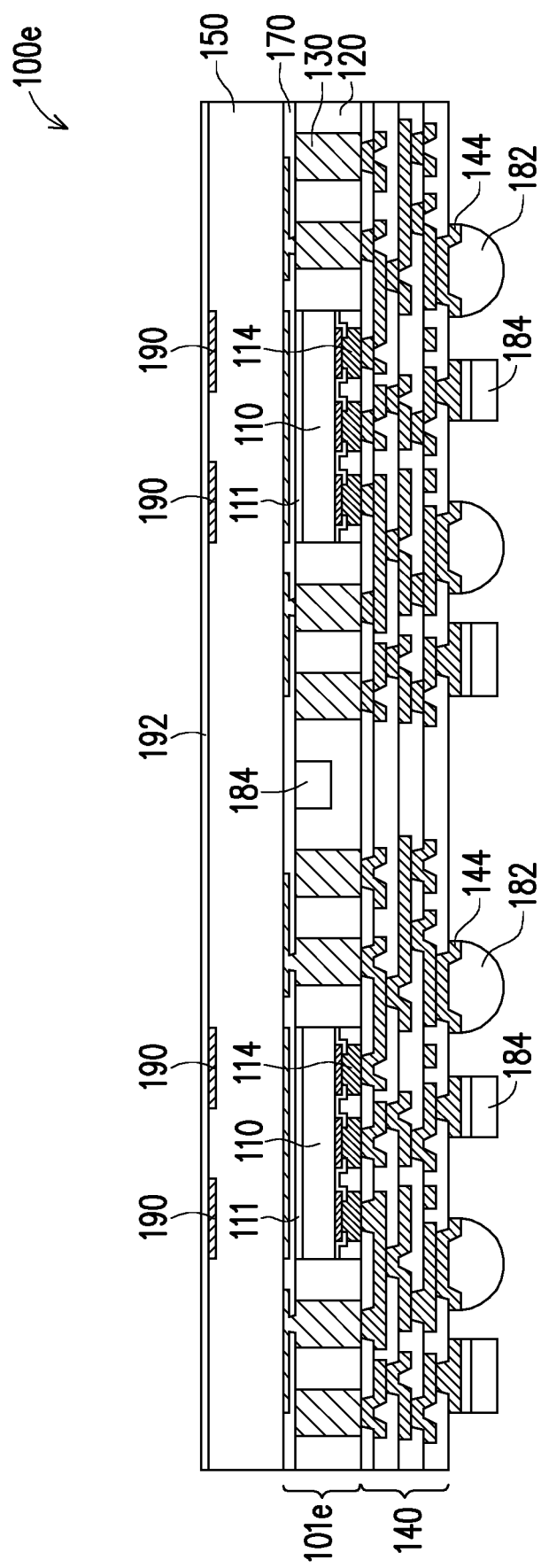

With now reference to FIG. 17, in some embodiments, the encapsulated semiconductor device 101e may include a plurality of semiconductor devices 110 (two semiconductor devices 110 are illustrated, but not limited thereto) arranged in, for example, a side-by-side manner. Accordingly, the through vias 130 may be formed to surround each of the semiconductor devices 110, and the encapsulation material 120 encapsulates the semiconductor devices 110 and the through vias 130. In some embodiments, the encapsulated semiconductor device 101e may further include an integrated passive device (IPD) 184 encapsulated by the encapsulation material 120. The antenna 190 may be embedded in the insulating layer 150 formed on the encapsulated semiconductor device 101e to form the semiconductor package 100e.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a method including followings is provided. An encapsulated device including a semiconductor die and an insulating encapsulation laterally encapsulating the semiconductor die is provided. An insulating layer is formed over a surface of the encapsulated device. A groove pattern is formed on the insulating layer. A conductive paste is filled in the groove pattern and the conductive paste filled in the groove pattern is cured. In some embodiments, providing the encapsulated device including forming a backside redistribution structure on a carrier; placing the semiconductor die on the backside redistribution structure, wherein the semiconductor die comprises an active surface and a back surface opposite to the active surface, and the back surface of the semiconductor die is in contact with and faces the backside redistribution structure; laterally encapsulating the semiconductor die with the insulating encapsulation to form the encapsulated device on the backside redistribution structure; de-bonding the encapsulated device and the backside redistribution structure from the carrier; and forming a front side redistribution structure on the encapsulated device de-bonded from the carrier, wherein the active surface of the semiconductor die faces the front side redistribution structure, and the semiconductor die is electrically connected to the front side redistribution structure. In some embodiments, the insulating layer is formed on the front side redistribution structure de-bonded from the carrier. In some embodiments, the groove pattern is formed by laser drilling. In some embodiments, the method further includes performing a planarizing process on the conductive paste and the insulating layer after curing the conductive paste filled in the groove pattern. In some embodiments, the method further includes forming a protection layer on the insulating layer to cover the conductive paste and the insulating layer after curing the conductive paste filled in the groove pattern.

In accordance with some other embodiments of the disclosure, a method including followings is provided. An encapsulated semiconductor device is formed on a carrier. The carrier is removed from the encapsulated semiconductor device. An insulating layer is formed on a side of the encapsulated semiconductor device where the carrier is removed from. An antenna is formed in the groove pattern by filling a conductive paste in a groove pattern followed by a curing process. In some embodiments, an upper surface of the antenna is substantially coplanar with an upper surface of the insulating layer. In some embodiments, the groove pattern is formed by laser drilling. In some embodiments, the method further includes performing a planarizing process on the antenna and the insulating layer after the curing process. In some embodiments, the method further includes forming a protection layer on the insulating layer to cover the upper surface of the antenna and the upper surface of the insulating layer. In some embodiments, the conductive paste is filled in the groove pattern without using a mask or a stencil. In some embodiments, the conductive paste is filled in the groove pattern without using a screen printing process. In some embodiments, the method further includes performing a planarizing process on the antenna and the insulating layer after curing the conductive paste.

In accordance with some alternative embodiments of the disclosure, a method including followings is provided. An encapsulated semiconductor device including a first-side redistribution structure and a second second-side redistribution structure disposed on opposite sides thereof is provided. An insulating layer covering the first-side redistribution structure is formed. A groove pattern is formed on the insulating layer. A conductive paste is filled in the groove pattern through a squeegee. The conductive paste is filled in the groove pattern to form an antenna embedded in the groove pattern of the insulating layer. In some embodiments, the conductive paste is filled in the groove pattern without using a mask or a stencil. In some embodiments, the conductive paste is filled in the groove pattern without using a screen printing process. In some embodiments, the groove pattern is formed by laser drilling. In some embodiments, the method further includes performing a planarizing process on the conductive paste after curing the conductive paste. In some embodiments, the method further includes forming a protection layer to cover an upper surface of the conductive paste after curing the conductive paste.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing an encapsulated device comprising a semiconductor die and an insulating encapsulation laterally encapsulating the semiconductor die;
forming an insulating layer over a surface of the encapsulated device;
forming a groove pattern on the insulating layer; and
filling a conductive paste in the groove pattern and curing the conductive paste filled in the groove pattern.
2. The method as claimed in claim 1, wherein providing the encapsulated device comprising:
forming a backside redistribution structure on a carrier;
placing the semiconductor die on the backside redistribution structure, wherein the semiconductor die comprises an active surface and a back surface opposite to the active surface, and the back surface of the semiconductor die is in contact with and faces the backside redistribution structure;
laterally encapsulating the semiconductor die with the insulating encapsulation to form the encapsulated device on the backside redistribution structure;
de-bonding the encapsulated device and the backside redistribution structure from the carrier; and
forming a front side redistribution structure on the encapsulated device de-bonded from the carrier, wherein the active surface of the semiconductor die faces the front side redistribution structure, and the semiconductor die is electrically connected to the front side redistribution structure.

3. The method as claimed in claim 2, wherein the insulating layer is formed on the front side redistribution structure de-bonded from the carrier.

4. The method as claimed in claim 1, wherein the groove pattern is formed by laser drilling.

5. The method as claimed in claim 1 further comprising:
after curing the conductive paste filled in the groove pattern, performing a planarizing process on the conductive paste and the insulating layer.

6. The method as claimed in claim 1 further comprising:
after curing the conductive paste filled in the groove pattern, forming a protection layer on the insulating layer to cover the conductive paste and the insulating layer.

7. A method, comprising:
forming an encapsulated semiconductor device on a carrier;
removing the carrier from the encapsulated semiconductor device;
forming an insulating layer on a side of the encapsulated semiconductor device where the carrier is removed from;
forming a groove pattern on the insulating layer; and
forming an antenna in the groove pattern by filling a conductive paste in a groove pattern followed by a curing process.

8. The method as claimed in claim 7, wherein an upper surface of the antenna is substantially coplanar with an upper surface of the insulating layer.

9. The method as claimed in claim 7, wherein the groove pattern is formed by laser drilling.

10. The method as claimed in claim 7 further comprising:
performing a planarizing process on the antenna and the insulating layer after the curing process.

11. The method as claimed in claim 7 further comprising:
forming a protection layer on the insulating layer to cover the upper surface of the antenna and the upper surface of the insulating layer.

12. The method as claimed in claim 7, wherein the conductive paste is filled in the groove pattern without using a mask or a stencil.

13. The method as claimed in claim 7, wherein the conductive paste is filled in the groove pattern without using a screen printing process.

14. The method as claimed in claim 7, further comprising:
after curing the conductive paste, performing a planarizing process on the antenna and the insulating layer.

15. A method, comprising:
providing an encapsulated semiconductor device comprising a first-side redistribution structure and a second second-side redistribution structure disposed on opposite sides thereof;
forming an insulating layer covering the first-side redistribution structure;
forming a groove pattern on the insulating layer;
filling a conductive paste in the groove pattern through a squeegee; and
curing the conductive paste filled in the groove pattern to form an antenna embedded in the groove pattern of the insulating layer.

16. The method as claimed in claim 15, wherein the conductive paste is filled in the groove pattern without using a mask or a stencil.

17. The method as claimed in claim 15, wherein the conductive paste is filled in the groove pattern without using a screen printing process.

18. The method as claimed in claim 15, wherein the groove pattern is formed by laser drilling.

19. The method as claimed in claim 15 further comprising:
after curing the conductive paste, performing a planarizing process on the conductive paste.

20. The method as claimed in claim 15 further comprising:
after curing the conductive paste, forming a protection layer to cover an upper surface of the conductive paste.

* * * * *